United States Patent
Ma et al.

(10) Patent No.: US 10,103,356 B2
(45) Date of Patent: Oct. 16, 2018

(54) OLED DISPLAY DEVICE HAVING SIDE SURFACE INSULATING STRUCTURE AND OLED DISPLAY APPARATUS USING THE SAME

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Qun Ma, Beijing (CN); You Tae Won, Beijing (CN); Haidong Wu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 67 days.

(21) Appl. No.: 14/769,689

(22) PCT Filed: Oct. 16, 2014

(86) PCT No.: PCT/CN2014/088706
§ 371 (c)(1),
(2) Date: Aug. 21, 2015

(87) PCT Pub. No.: WO2016/023266
PCT Pub. Date: Feb. 18, 2016

(65) Prior Publication Data
US 2016/0276629 A1    Sep. 22, 2016

(30) Foreign Application Priority Data
Aug. 12, 2014  (CN) .......................... 2014 1 0397191

(51) Int. Cl.
*H01L 29/08*    (2006.01)
*H01L 51/52*    (2006.01)
(Continued)

(52) U.S. Cl.
CPC ...... *H01L 51/5275* (2013.01); *H01L 27/3246* (2013.01); *H01L 51/5209* (2013.01);
(Continued)

(58) Field of Classification Search
CPC ............. H01L 51/5275; H01L 51/5209; H01L 51/5225; H01L 51/5253; H01L 27/3246; H05B 33/22
See application file for complete search history.

(56) References Cited

U.S. PATENT DOCUMENTS

2004/0080264 A1  4/2004  Ichikawa
2004/0188690 A1  9/2004  Noguchi
(Continued)

FOREIGN PATENT DOCUMENTS

CN  103050838 A  4/2013
CN  103500754 A  1/2014
(Continued)

OTHER PUBLICATIONS

First Chinese Office Action dated Jun. 30, 2016; Appln. No. 201410397191.X.
(Continued)

*Primary Examiner* — Matthew Gordon
(74) *Attorney, Agent, or Firm* — Ladas & Parry LLP

(57) ABSTRACT

An organic light-emitting diode (OLED) display device and an OLED display apparatus using the same are disclosed. The OLED display device includes a plurality of pixels (16) arranged in an array on a substrate (11), a side surface of a light-emitting layer (13) of the pixels (16) being covered with a first insulating structure (14) having a refractive index
(Continued)

less than that of the light-emitting layer (13). The OLED display device has a high light extracting rate.

12 Claims, 2 Drawing Sheets

(51) Int. Cl.
 *H01L 27/32* (2006.01)
 *H05B 33/22* (2006.01)
(52) U.S. Cl.
 CPC ...... *H01L 51/5225* (2013.01); *H01L 51/5253* (2013.01); *H05B 33/22* (2013.01)

(56) References Cited

U.S. PATENT DOCUMENTS

| | | | |
|---|---|---|---|
| 2005/0042477 A1* | 2/2005 | Miyashita et al. | ............................ H01L 27/3211 428/690 |
| 2010/0252857 A1* | 10/2010 | Nakatani | ............. H01L 27/3246 257/100 |
| 2013/0069046 A1* | 3/2013 | Ishizuya | ............. H01L 51/5271 257/40 |
| 2014/0346485 A1* | 11/2014 | Noda | .................. H01L 51/5275 257/40 |
| 2015/0206927 A1* | 7/2015 | Kuroda | .................. H05B 33/28 257/40 |
| 2017/0033163 A1 | 2/2017 | Jiao et al. | |

FOREIGN PATENT DOCUMENTS

| | | |
|---|---|---|
| CN | 103943661 A | 7/2014 |
| JP | 2004-296219 A | 10/2004 |
| JP | 2013-190661 A1 | 2/2016 |
| WO | 2013084629 A1 | 6/2013 |

OTHER PUBLICATIONS

Second Chinese Office Action dated Oct. 19, 2016; Appln. No. 201410397191.X.

International Search Report & Written Opinion of the International Searching Authority Appln. No. PCT/CN2014/088706; dated Apr. 28, 2015.

Jianyong Zhao; "Organic Light-Emitting Diode (OLED) Display Technology", Jul. 31, 2012; National Defense Industry Press, 5 pages Third Chinese Office Action dated Mar. 24, 2017; Appln. No. 201410397191.X.

* cited by examiner

OLED DISPLAY DEVICE HAVING SIDE SURFACE INSULATING STRUCTURE AND OLED DISPLAY APPARATUS USING THE SAME

TECHNICAL FIELD

At least one embodiment of the present invention relates to an OLED display device and a display apparatus using the same.

BACKGROUND

Compared with a liquid crystal display apparatus, an OLED (Organic Light-Emitting Diode) display apparatus is lighter and self-luminous, consumers less power, needs no backlight source, has no viewing angle restriction and a high reaction rate, and so on.

An OLED display device in the OLED display apparatus comprises two structures: a bottom emission structure and a top emission structure. Taking the top emission structure as an example, the OLED display device comprises a plurality of pixels arranged in an array, each pixel comprising an anode, a light-emitting layer and a cathode formed sequentially on a substrate. When voltage is applied between the anode and the cathode, an electron hole migrates from the anode to the light-emitting layer and is complexed with an electron migrated from the cathode to stimulate a light-emitting material in the light-emitting layer to produce light, which is emitted through the cathode to achieve a top emission.

SUMMARY

At least one embodiment of the present invention provides an OLED display device and an OLED display apparatus using the same to solve the problem of a low light extracting rate of the OLED display device.

At least one embodiment of the present invention provides an OLED display device, comprising a plurality of pixels arranged in an array on a substrate, a side surface of a light-emitting layer of the pixels being covered with a first insulating structure having a refractive index less than that of the light-emitting layer.

At least one embodiment of the present invention provides an OLED display apparatus, comprising the above OLED display device.

BRIEF DESCRIPTION OF THE DRAWINGS

In order to illustrate the technical solutions of the embodiments of the present invention more clearly, the figures of the embodiments are simply described below. Apparently, the figures described below merely relate to some embodiments of the present invention rather than are limitative of the present invention.

DETAILED DESCRIPTION

To make the object, technical solutions, and advantages of the present invention clearer, the technical solutions of the embodiments of the present invention will be described below in a clearer and more complete way with reference to the figures of the embodiments of the present invention. Apparently, the embodiments described are only part, rather than all of the embodiments of the present invention. Based on the embodiments of the present invention described, all the other embodiments obtained by a person of ordinary skill in the art without paying inventive work fall within the scope of protection of the present invention.

The inventors of the present application have noted that as for an OLED display device, the light produced by the light-emitting layer in the pixels will be scattered, i.e., in addition to the light emitted towards the cathode, some light will be emitted from the side surface of the light-emitting layer. As a result, the rate of the light emitted from the light-emitting surface of the OLED display device (i.e., the light emitted from cathodes of all the pixels) to the light produced by the light-emitting layers of all the pixels (called as the light extracting rate of the OLED display device) is low.

Figure 1:
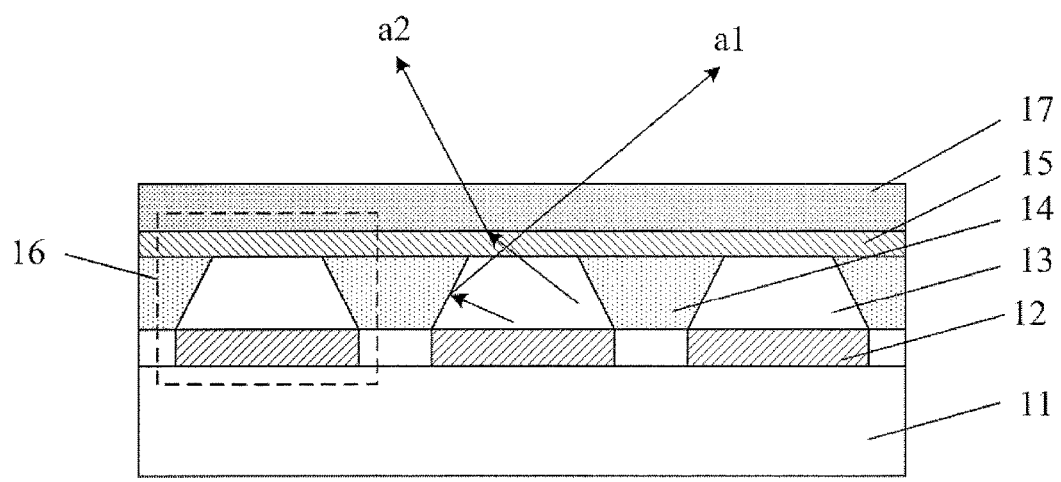
FIG. 1 is a schematic view of an OLED display device in an embodiment of the present invention.

At least one embodiment of the present invention provides an OLED display device. As shown in FIG. 1, the OLED display device comprises a plurality of pixels 16 arranged in an array on a substrate 11, the pixels 16 comprising an anode 12, a light-emitting layer 13 and a cathode 15 formed sequentially on the substrate 11. The side surface of the light-emitting layer 13 of the pixels 16 is covered with a first insulating structure 14 having a refractive index less than that of the light-emitting layer 13.

The following embodiments are illustrated taking the OLED device having a top emission structure as an example, but the embodiments of the present invention are not limited thereto.

In the OLED display device provided in the embodiments of the present invention, when voltage is applied between the anode 12 and the cathode 15, the light-emitting layer 13 of the pixels 16 will be stimulated to produce light a1 which is propagated towards the side surface of the light-emitting layer 13 to reach the interface of the light-emitting layer 13 and the first insulating structure 14. Since the refractive index n1 of the first insulating structure 14 is less than the refractive index n0 of the light-emitting layer 13, the light a1 is totally reflected at the interface, which changes the propagation direction of the light a1. Consequently, the light a1 can be emitted from the light-emitting surface of the OLED display device via the cathode 15. As such, since the light a1 emitted towards the side surface of the light-emitting layer 13 can also be finally emitted from the light-emitting surface of the OLED display device, the light extracting rate of the OLED display device is increased.

In the OLED display device provided in the above embodiments, the first insulating structure 14 may be filled in the space between the light-emitting layers 13 of two adjacent pixels 16, as is shown in FIG. 1. For example, as shown in FIG. 1, the first insulating structure 14 may have the same thickness as the light-emitting layer 13 such that a flat surface is formed on the upper surface of each light-emitting layer 13.

Figure 2:
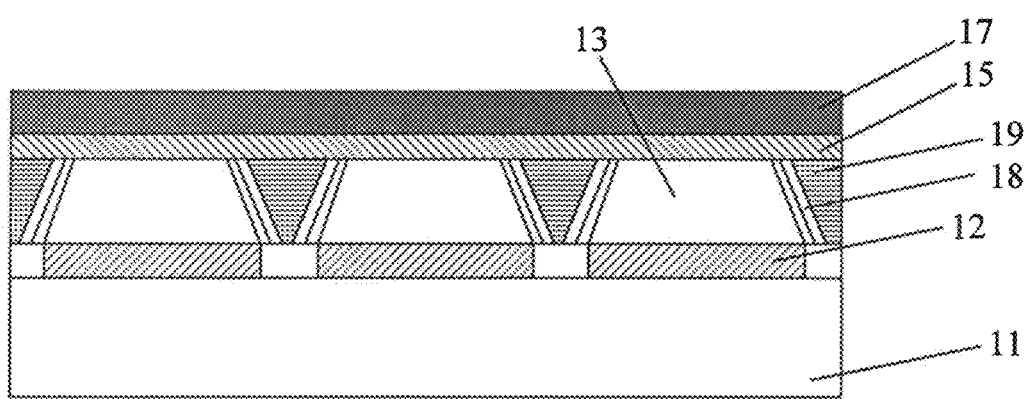
FIG. 2 is a schematic view of an OLED display device in an embodiment of the present invention.

In the OLED display device provided in the above embodiments, the first insulating structure 14 may also not be fully filled in the gap between the light-emitting layers 13 of two adjacent pixels 16. Instead, the first insulating structure 14 can only be a thin film (one or more thin film(s) 18 as shown in FIG. 2) covering the side surface of the light-emitting layer so as to reduce the volume of the first insulating structure 14, thereby reducing the amount of the raw material required to form the first insulating structure 14.

After covering the side surface of the light-emitting layer 13 with the thin film, the gap between the light-emitting layers 13 of two adjacent pixels can be filled with other materials (e.g., insulating materials) so as to form a flat surface on the upper surface of each light-emitting layer 13. Therefore, in one embodiment, in addition to a thin film covering the side surface of the light-emitting layer, the first insulating structure can further comprise a planarization structure (19) (as shown in FIG. 2) filled in the gap between the thin film covering the side surface of the light-emitting layers of two adjacent pixels, and a material for forming the planarization structure is different from that for forming the thin films.

Comparing the manner in which the first insulating structure 14 is fully filled in the gap between the light-emitting layers of two adjacent pixels with the manner in which the first insulating structure 14 is only a thin film covering the side surface of the light-emitting layer 13 and is not fully filled in the gap between the light-emitting layers of two adjacent pixels, the latter requires more manufacturing procedures at a relatively higher cost.

In the OLED display device provided in the above embodiments, the first insulating structure 14 can be made of, for example, an organic material which is a conventional material for an insulating structure. The insulating structure manufactured using the organic material has a uniform film thickness and a small error in refractive index.

The OLED display device provided in the above embodiments may further comprise a second insulating structure 17. As shown in FIG. 1, the second insulating structure 17 covers the side of the light-exiting surface of a plurality of pixels and the first insulating structure, and has a refractive index n2 greater than the refractive index n0 of the light-emitting layer 13.

The second insulating structure 17 is formed on the cathode 15. The light a2 produced by the light-emitting layer 13 enters the second insulating structure 17 after passing through the cathode 15, and the light emitted from the light-exiting surface of the second insulating structure 17 is the light emitted from the light-emitting surface of the OLED device. In general cases, the cathode 15 is quite thin, and as the light a2 passes through the cathode 15, the change in the propagation direction and the loss of energy can be neglected. Therefore, it can be deemed that the refractive index of the cathode 15 is the same as the refractive index n0 of the light-emitting layer 13.

As the light a2 reaches the interface of the cathode 15 and the second insulating structure 17, the light a2 is not prone to total reflection because the refractive index n2 of the second insulating structure 17 is greater than the refractive index n0 of the light-emitting layer, which ensures that all the light reaching the interface of the cathode 15 and the second insulating structure 17 can be emitted into the second insulating structure 17 and emitted via the second insulating structure 17, thereby further increasing the light extracting rate of the OLED display device.

In the OLED display device provided in the above embodiments, the second insulating structure 17 may be made of, for example, an organic material which can be a conventional material for an insulating structure. The insulating structure manufactured using the organic material has a uniform film thickness and a small error in refractive index.

In the OLED display device provided in the above embodiments, cathodes 15 of all the pixels 16 can be formed coplanarly, for example, they can constitute a continuous plate-like electrode as a whole; anodes 12 of all the pixels 16 can be separate structures for the pixels, for example, they can constitute discontinuous strip-like electrodes, which can simplify the manufacturing process. FIG. 1 shows the OLED display device of such a structure, where the anode 12 of each pixel 16 is a segment of the discontinuous strip-like electrodes formed by all anodes 12, and the anode 12 is made of a conductive material (such as Ag) having reflective properties. As such, the light produced by the light-emitting layer 13 can be reflected by the anode 12 so as to be emitted from the cathode 15, thereby achieving the top emission function. The cathode 15 is an overall structure, i.e., the cathodes 15 of all pixels are formed coplanarly. When the OLED display device works, a voltage is applied on the cathode 15, and when a pixel is required to be lit, another voltage is correspondingly applied on the anode 12 of the pixel. As such, a voltage difference is formed between the anode 12 and the cathode 15. The OLED display device of such a structure generally forms a thin film transistor drive circuit (not shown in FIG. 1) corresponding to each pixel 16, which drives each pixel by means of active matrix.

Needless to say, the embodiments of the present invention are not limited to be applied in the OLED display device with the structure shown in FIG. 1. For example, in one embodiment, the cathodes of all pixels in the OLED display device can be formed coplanarly (for example, constitute a continuous plate-like electrode), while the cathodes are separate structures for the pixels (for example, they can constitute discontinuous strip-like electrodes); in another embodiment of the present invention, the cathodes 15 and the anodes 12 of all pixels 16 can constitute discontinuous strip-like electrodes, i.e., the anodes and the cathodes in the OLED display device are all separate structures for the pixels.

At least one embodiment of the present invention further provides an OLED display apparatus, comprising the OLED display device described in the above embodiments. The display apparatus can be any product or component having display function such as an OLED panel, electronic paper, a mobile phone, a tablet computer, a TV set, a display, a laptop, a digital picture frame, a navigator or the like.

In the OLED display apparatus provided in the embodiments of the present invention, the display performance can be significantly improved because the OLED display device having an increased light extracting rate described in the above embodiments is used.

The above are merely embodiments of the present invention, but the scope of the present invention is not limited thereto. The change or replacement readily conceived of by any person skilled in the art within the technical scope disclosed in the present invention shall be covered within the scope of protection of the present invention. Accordingly, the scope of protection of the present invention shall be based on the scope of protection of the claims.

The present application claims the priority of the Chinese Patent Application No. 201410397191.X submitted on Aug. 12, 2014, and the content disclosed in the above Chinese patent application is herein incorporated by reference as part of this application.

What is claimed is:

1. An organic light-emitting diode (OLED) display device, comprising a plurality of pixels arranged in an array on a substrate, wherein a side surface of a light-emitting layer of the plurality of pixels is covered with a first insulating structure having a refractive index less than that of the light-emitting layer;

in a direction vertical to the substrate, a thickness of the first insulating structure is equal to a thickness of the light-emitting layer;

the OLED display device further comprising a second insulating structure, wherein the second insulating structure covers a side of a light-exiting surface of the plurality of pixels and the first insulating structure and has a refractive index greater than that of the light-emitting layer;

wherein the first insulating structure has a uniform composition and is made of an organic material.

2. The OLED display device according to claim 1, wherein the first insulating structure is filled in a space between the light-emitting layers of two adjacent pixels.

3. The OLED display device according to claim 1, wherein the first insulating structure comprises one or more thin films covering the side surface of the light-emitting layer.

4. The OLED display device according to claim 3, wherein the first insulating structure further comprises a planarization structure filled in a gap between two adjacent pixels, and a material for forming the planarization structure is different from that for forming the thin films.

5. The OLED display device according to claim 1, wherein the second insulating structure is made of an organic material.

6. The OLED display device according to claim 1, wherein cathodes of all the pixels are formed coplanarly, or anodes of all the pixels are formed coplanarly.

7. The OLED display device according to claim 6, wherein:
the cathodes of all the pixels constitute a continuous plate-like electrode and the anodes of all the pixels constitute discontinuous strip-like electrodes; or
the anodes of all the pixels constitute a continuous plate-like electrode and the cathodes of all the pixels constitute discontinuous strip-like electrodes.

8. The OLED display device according to claim 1, wherein the cathodes and anodes of all the pixels constitute discontinuous strip-like electrodes.

9. An organic light-emitting diode (OLED) display apparatus, comprising the OLED display device according to claim 1.

10. The OLED display device according to claim 2, wherein cathodes of all the pixels are formed coplanarly, or anodes of all the pixels are formed coplanarly.

11. The OLED display device according to claim 10, wherein:
the cathodes of all the pixels constitute a continuous plate-like electrode and the anodes of all the pixels constitute discontinuous strip-like electrodes; or
the anodes of all the pixels constitute a continuous plate-like electrode and the cathodes of all the pixels constitute discontinuous strip-like electrodes.

12. The OLED display device according to claim 2, wherein the cathodes and anodes of all the pixels constitute discontinuous strip-like electrodes.

* * * * *